(12) United States Patent
Shimonishi et al.

(10) Patent No.: US 7,569,867 B2
(45) Date of Patent: Aug. 4, 2009

(54) LIGHT-EMITTING DEVICE AND METHOD OF MAKING SAME

(75) Inventors: Sumio Shimonishi, Tokyo (JP); Akira Takekuma, Tokyo (JP); Yoshifumi Yamaoka, Kanagawa (JP)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 115 days.

(21) Appl. No.: 11/252,917

(22) Filed: Oct. 18, 2005

(65) Prior Publication Data

US 2006/0114678 A1    Jun. 1, 2006

(30) Foreign Application Priority Data

Nov. 26, 2004    (JP) .............................. 2004-342502

(51) Int. Cl.
    *H01L 29/74*    (2006.01)
(52) U.S. Cl. ................. 257/172; 257/79; 257/E33.056; 257/161
(58) Field of Classification Search ................. 359/665; 257/79–98, E33.056–33.059, 25.032
    See application file for complete search history.

(56) References Cited

U.S. PATENT DOCUMENTS

| | | | |
|---|---|---|---|
| 6,369,954 B1* | 4/2002 | Berge et al. ................. | 359/666 |
| 6,449,081 B1* | 9/2002 | Onuki et al. ................. | 359/245 |
| 6,707,069 B2 | 3/2004 | Song et al. | |
| 6,850,001 B2* | 2/2005 | Takekuma ................... | 313/501 |
| 7,201,318 B2* | 4/2007 | Craen et al. ................. | 235/454 |
| 2006/0067264 A1 | 3/2006 | Whaley | |
| 2006/0285220 A1* | 12/2006 | Van As et al. ............... | 359/665 |
| 2007/0085103 A1* | 4/2007 | Nishioka et al. ............. | 257/99 |

FOREIGN PATENT DOCUMENTS

| | | |
|---|---|---|
| JP | 5872858 | 5/1983 |
| JP | 08-078727 | 3/1996 |
| JP | 2002169005 | 6/2002 |
| JP | 2002221658 | 8/2002 |
| JP | 2004-072572 | 3/2004 |
| JP | 2004-104423 | 4/2004 |
| JP | 2004-129495 | 4/2004 |
| WO | WO 99/18456 | 4/1999 |
| WO | WO 00/58763 | 10/2000 |

\* cited by examiner

*Primary Examiner*—Fernando L Toledo
*Assistant Examiner*—Swapneel Chhaya

(57) ABSTRACT

A light-emitting device which comprises as one unit a semiconductor light-emitting element; a first liquid for condensing the light from the semiconductor light-emitting element; a second liquid that is separate from but contacts the first liquid; an airtight space in which at least first liquid and second liquid are disposed; and first and second electrodes to which voltage is applied so as to change the shape of the interface between first liquid and second liquid and adjust the condensed state of the light from semiconductor light-emitting element.

14 Claims, 10 Drawing Sheets

LIGHT-EMITTING DEVICE AND METHOD OF MAKING SAME

FIELD OF THE INVENTION

The present invention relates to a light-emitting device that uses LED (light-emitting diode) chips, or other light-emitting elements, and a method for producing the same, and in particular, relates to light-emitting components having the function of condensing the light from the light-emitting elements.

DISCUSSION OF THE BACKGROUND ART

Light-emitting diodes wherein a chip is disposed near the tip of a pair of metal leads and this chip is enclosed by a resin shell are generally known as light-emitting devices comprising LED chips. The LED chips are usually disposed inside a cup that is made by press molding at the tip of the metal leads. The cup has the effect of directing upward the light from the light-emitting element. The curved surface at the top of the resin shell has a sufficient curvature and acts as a lens for condensing the light that has been directed upward by the cup, or the light that comes directly from the light-emitting elements, at the top of the resin.

Another known example is a structure wherein a light-emitting element is disposed inside a container and a separately formed lens member is anchored to the top surface of the container in order to condense the light from the light-emitting element (JP (Kokai) [Unexamined Japanese Patent Publication] 2003-124,525).

By means of these examples, the shape and position of the lens is fixed and the focal point distance and other parameters that determine the condensed state cannot be changed.

On the other hand, it is known that the focal point distance of the lens of optical systems other than light-emitting devices, for instance, cameras and other optical systems being sold, is not fixed and the focal point distance and other optical parameters can be changed as needed. There are lens systems comprising optical systems wherein the lens is mechanically moved (JP (Kokai) [Unexamined Japanese Patent Publication] 2004-72,572; JP (Kokai) [Unexamined Japanese Patent Publication] 2004-104,423; and JP (Kokai) [Unexamined Japanese Patent Publication] 2004-129,495) and those wherein the lens uses a liquid (JP (Kohyo) [National Publication of International Patent Application] 2001-519,539; and JP (Kohyo) [National Publication of International Patent Application] 2002-540,464).

Light-emitting diodes and other light-emitting devices have recently been used for various types of lighting. It is preferred that the condensed state of light from the light-emitting element can be changed in accordance with specific applications, such as auxiliary light for a camera AF (autofocus) or for illumination.

Nevertheless, there is a problem when the light-emitting device and the device for adjusting the condensed state are separate parts, they are not convenient to handle, and they are difficult to adjust in order to produce with good precision the desired condensed state.

Therefore, the object of the present invention is to provide a light-emitting device comprising a condensation means, which is small and easy to handle, and with which it is possible to easily adjust the condensed state of the light-emitting device with good precision, and a method for producing the same.

SUMMARY OF THE INVENTION

The light-emitting device of the present invention comprises as one unit a semiconductor light-emitting element; a first liquid for condensing light from the semiconductor light-emitting element; a second liquid that is separate from the first liquid but contacts the first liquid; an airtight space in which at least the first liquid and the second liquid are disposed; and an electrode for generating a field that intersects a part of the inside walls comprising the airtight space such that the shape of the interface between the first and second liquids is changed and the condensed state of the light from the semiconductor light-emitting element is adjusted.

The electrode is positioned such that it is virtually axially symmetric to the semiconductor light-emitting element, and it comprises a first electrode, which is placed outside the inside walls away from the first and second liquids and near the boundary between the first and second liquids, and a second electrode, which is placed near the second liquid. The first and second liquids are selected from materials that have different wetting capabilities for a solid surface. Preferably, the first liquid comprises an insulating material that can intensely wet a hydrophobic surface and the second liquid comprises a conducting material that can intensely wet a hydrophilic surface. The first liquid is positioned with no field applied along the part of the inside wall where there is intense wettability by the first liquid such that it is placed over the semiconductor light-emitting element.

The airtight space can be made in a sub-assembly for the airtight housing of the first and second liquids. The sub-assembly has a window for receiving light from the semiconductor light-emitting element. The base of the sub-assembly is convex and is anchored in alignment with the light-emitting element assembly comprising the semiconductor light-emitting element.

According to yet another characteristic of the present invention, the light-emitting device comprises a substrate; a semiconductor light-emitting element on the substrate; a box-shaped container enclosing the semiconductor light-emitting element; a resin for keeping the semiconductor light-emitting element airtight inside this container; and a lens module for adjusting the focal point distance that is anchored in alignment with this container. It is preferred that the base of the lens module is convex, and the container and the lens module comprise engaging means by means of which they are mechanically aligned and engaged with one another.

The method for producing a light-emitting device of the present invention comprises a step for placing a semiconductor light-emitting element on a substrate; a step for placing a box around the outside of the semiconductor light-emitting element; a step for positioning a first and a second electrode; a step for positioning a first liquid in a dome over the semiconductor light-emitting element; a step for placing a second liquid over the first liquid such that the first electrode is insulated away from the first and second liquids and the second electrode is near the second liquid; and a step for evacuating air to keep the first and second liquids airtight.

According to yet another characteristic of the present invention, the method for producing a light-emitting device comprises a step for placing a semiconductor light-emitting element on a substrate; a step for forming a container with space on the inside and comprising a window with a transparent material, a first electrode formed away from the inside space, and a second electrode placed inside the inside space that, together with the first electrode, generates a field that intersects the inside walls demarcating the inside space; a step for filling the container with a first liquid for condensing light from the semiconductor light-emitting element and a second liquid that is separate from the first liquid, but contacts the first liquid, and is near the second electrode; a step for airtight sealing of the container and completing the sub-assembly comprising the container; and a step for anchoring the sub-assembly to the semiconductor light-emitting element on the substrate.

According to yet another characteristic of the present invention, the method for producing a light-emitting device comprises a step for placing a semiconductor light-emitting element on a substrate; a step for anchoring a box at a predetermined position with respect to the semiconductor light-emitting element such that the semiconductor light-emitting element is enclosed; a step for filling resin inside the box; and a step for engaging and anchoring a lens module for adjusting the focal point distance such that it is aligned with the box.

The light-emitting device of the present invention is a small device wherein the lens system and the light-emitting device are one unit, and is used for various purposes that require changing the condensed state of light. It can be used for purposes that require a device that is easy to handle, has a high operating precision, and a small-scale illumination, such as in medical devices. The light-emitting device allows for separate light emission and control of the lens system thereof. As a result, there is an advantage in that the lens system can be controlled, that is, the focal point distance or the irradiation distance can be changed, whether the lighting by the light-emitting device is on or off.

BRIEF DESCRIPTION OF THE DRAWINGS

FIG. 2(a) through (d) show the first through fourth steps in production, respectively.

FIGS. 7(a) and (b) show the first and last halves of production and are the first and second steps in production, respectively.

DETAILED DESCRIPTION OF THE PREFERRED EMBODIMENT

Figure 1:
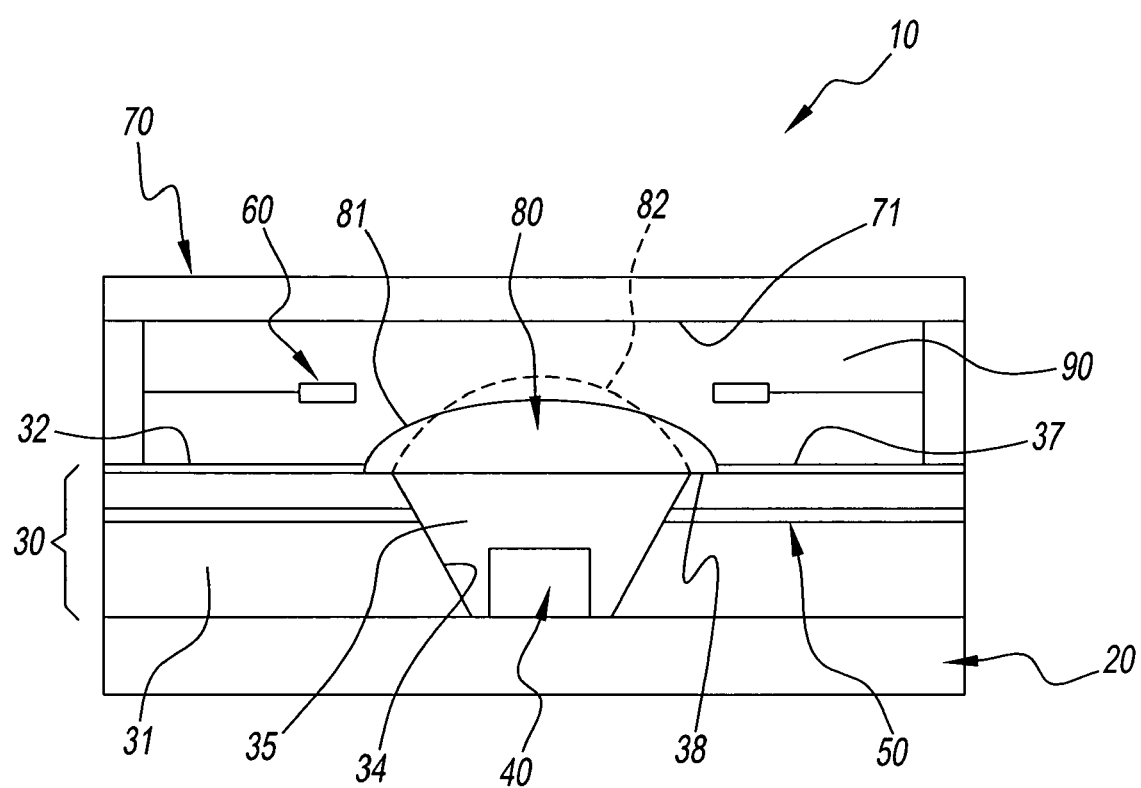
FIG. 1 is a cross section showing the first embodiment of the light-emitting device of the present invention.

A preferred embodiment of the light-emitting device and a method for producing the same of the present invention will now be described in detail while referring to the drawings. FIG. 1 is a cross section showing the first preferred embodiment of the light-emitting device of the present invention. A light-emitting device 10 in FIG. 1 comprises a light-emitting element 40, which is typically a light-emitting diode, and a condensation means for condensing the light reflected from this element. In further detail, light-emitting device 10 comprises a substrate 20 on which light-emitting element 40 is mounted; a bottom container 30 disposed such that it encloses light-emitting element 40; and liquid lens means 80 and 90 disposed above bottom container 30. The light from light-emitting element 40 passes through liquid lens means 80 and 90, but as will be discussed later, the condensed state of the light from light-emitting element 40 can be adjusted by controlling these liquid lens means 80 and 90.

Liquid lens means 80 and 90 are disposed inside an airtight space 71 made on the inside of top container 70. That is, virtually no gases other than first liquid 80 and second liquid 90, which comprise the lens means, are present inside airtight space 71. First liquid 80 typically comprises an insulating liquid that can intensely wet a hydrophobic surface, and the other second liquid 90 typically comprises a conductive liquid that can intensely wet a hydrophilic surface.

Liquid lens means 80 and 90 comprise a first liquid 80 for forming a convex lens along the path of the light from light-emitting element 40, and second liquid 90 for enclosing first liquid 80. As illustrated, first liquid 80 is on the plane that is formed by bottom container 30 and resin 35 that is introduced in such a way that light-emitting element 40 is sealed airtight inside an open part 34.

The top surface of bottom container 30 comprises a hydrophilic part 37 on the outside of a part 38 near the open part. Hydrophilic part 37 is formed by the necessary chemical or optical surface treatment. As a result, part 37 can be intensely wetted by second liquid 90, but can only be slightly wetted by the first liquid under normal conditions. On the other hand, part 38 that is at least near the open part and on the inside of part 37 can be intensely wetted by the first liquid, but can only be slightly wetted by the second liquid. Consequently, the interface between the first and second liquids forms a dome-like curved surface wherein the boundary between hydrophilic part 37 and part 38 near the open part that has not been surface-treated serves as the border, as shown by solid line 81 in FIG. 1.

Liquid lens means 80 and 90 are controlled by a pair of electrodes comprising a first electrode 50 and a second electrode 60. They are shown by cross section only in FIG. 1, but both electrodes 50 and 60 are axially symmetric in the circumferential direction such that they enclose light-emitting element 40.

As shown in the drawing, first electrode 50 is disposed near the end of first liquid 80, that is, close to part 38 near the open part, but away from, and electrically insulated from, first and second liquids 80 and 90. In further detail, bottom container 30 comprises separately a first container 31 and a second container 32, and first electrode 50 is placed such that it is sandwiched in between these containers. It is also possible to print first electrode 50 by conventional methods along the top surface of first container 31 comprising bottom container 30, or along the bottom surface of second container 32 comprising bottom container 30. Bottom container 30 can also be made as one unit by a multilayered circuit structure such that first electrode 50 is embedded inside.

On the other hand, as shown in the drawing, second electrode 60 is near the inside of second liquid 90 inside airtight space 71. As shown in the drawing, second electrode 60 is disposed close to part 38 near the open part and is supported such that it extends from inside top container 70 toward the middle. It should be noted that second electrode 60 does not necessarily conduct electricity to second liquid 90 and can also be in an insulated state.

Voltage is applied between first electrode 50 and second electrode 60 in order to adjust the condensed state of liquid lens means 80 and 90. As a result, wettability by second liquid 90 is improved at part 38 near the open part disposed between electrodes 50 and 60 by the electric field that is produced between first electrode 50 and second electrode 60. Thus, the stable state of the surface energy is changed and the interface between first liquid 80 and second liquid 90 changes from solid line 81 to broken line 82. This changes the direction of the light from light-emitting element 40 that is refracted at the interface between first liquid 80 and second liquid 90, and changes the condensed state of the light.

Figure 2:
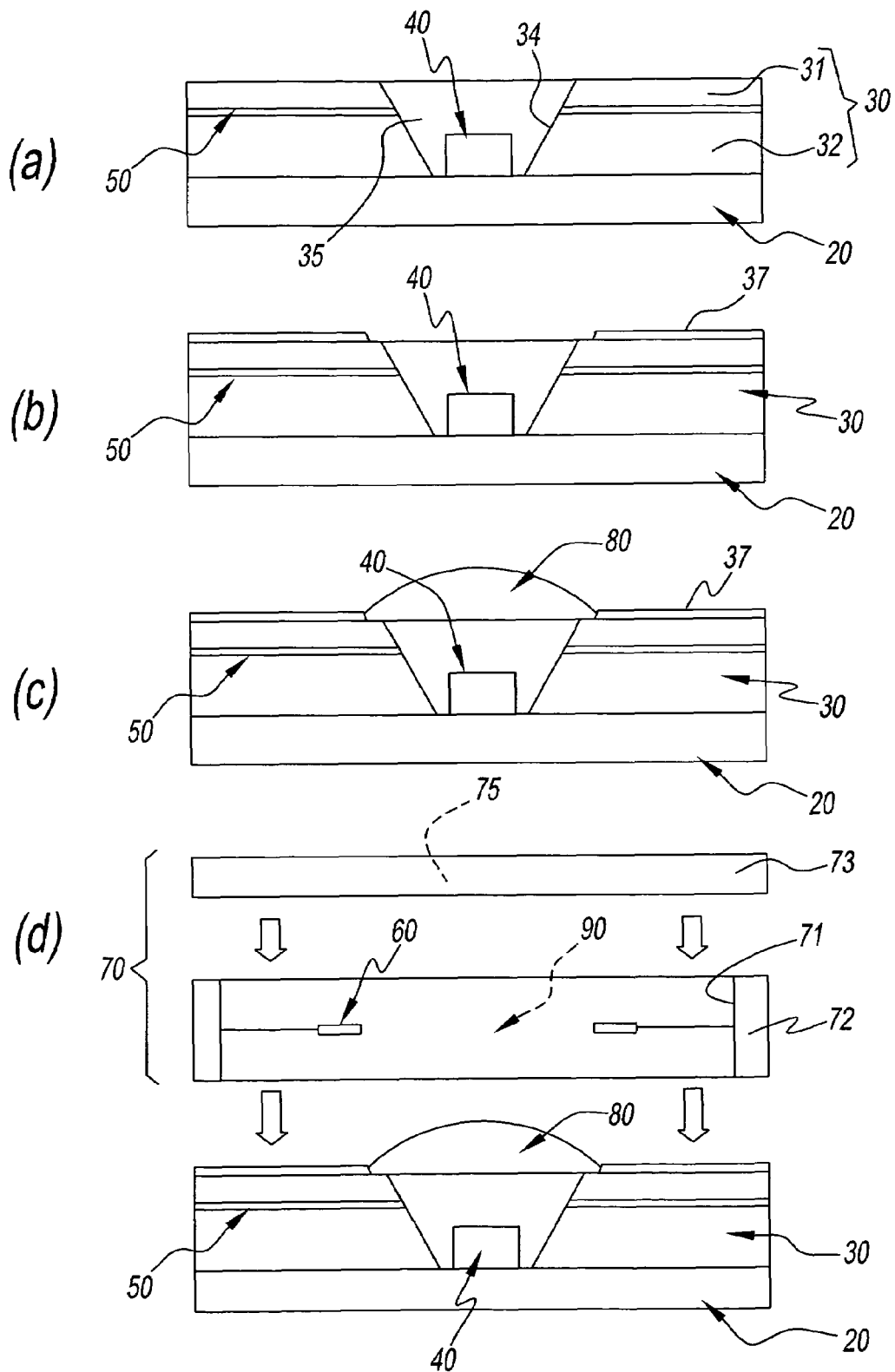
FIG. 2 is a cross section showing the method for producing the light-emitting device in FIG. 1.

FIG. 2 is a drawing showing the method for producing the light-emitting device in FIG. 1. FIGS. 2(*a*), (*b*), (*c*), and (*d*) show the respective first through fourth steps involved in production. By means of the first step, light-emitting element 40 is mounted on a substrate 20, and bottom container 30 is anchored around the outside of the element. As previously described, bottom container 30 can be a combination of first and second containers 31 and 32, or it can be handled as a single unit. Bottom container 30 is anchored on substrate 20 by conventional gluing, or by other means.

By means of the first step, a transparent resin 35 is filled inside open part 34 holding light-emitting element 40 to seal light-emitting element 40 airtight, and the top surface of the resin is smoothed essentially flat to form the same plane with the top surface of bottom container 30. First liquid 80 is disposed on the top surface of this resin 35; therefore, the resin is preferably a hydrophobic material. When necessary, the surface modification needed to change the top surface of resin 35 to a hydrophilic surface can be performed during the second step described below.

By means of the second step shown by FIG. 2(*b*), the appropriate surface modification is performed on the outside of part 38 near the open part at the top surface of container 31 such that this part becomes hydrophilic. The part that is hydrophilic is shown by 37. If the material of container 30 is originally hydrophilic, it is also possible to perform surface modification in order to make only part 38 hydrophobic.

By means of the third step shown in FIG. 2(*c*), first liquid 80 is placed on the top surface. First liquid 80 forms a stable dome shape on the inside of part 37 under its own surface tension.

By means of the fourth step shown in FIG. 2(*d*), a top container 70 is further assembled. By means of the present embodiment, top container 70 comprises a box 72 and a lid 73. As shown in the drawing, box 72 is a box with second electrode 60 on the inside. On the other hand, lid 73 is joined with the box to make an airtight space.

By means of the fourth step, first, box 72 is anchored by gluing or by another means to the top of bottom container 30. Although not illustrated, the appropriate alignment means can be made in box 72 so that second electrode 60 can be disposed at the appropriate position in relation to the first liquid. By means of the fourth step, second liquid 90 is introduced inside box 72 over first liquid 80 and air is thereby completely evacuated from airtight space 71. It should be noted that the step whereby first liquid 90 is disposed on bottom container 30, which is shown as the third step, can also be performed immediately after box 72 has been anchored on bottom container 30.

The final step is the fourth step, whereby lid 73 is anchored to the top of box 72. It is necessary to perform this step in such a way that air is kept from entering inside airtight space 71 and no air bubbles form. Furthermore, lid 73 can be made from a transparent resin, or, although not illustrated, a window 75 can be made in the middle of the lid for the transmission of light from light-emitting element 40 that has passed through liquid lens means 80 and 90.

Figure 3:
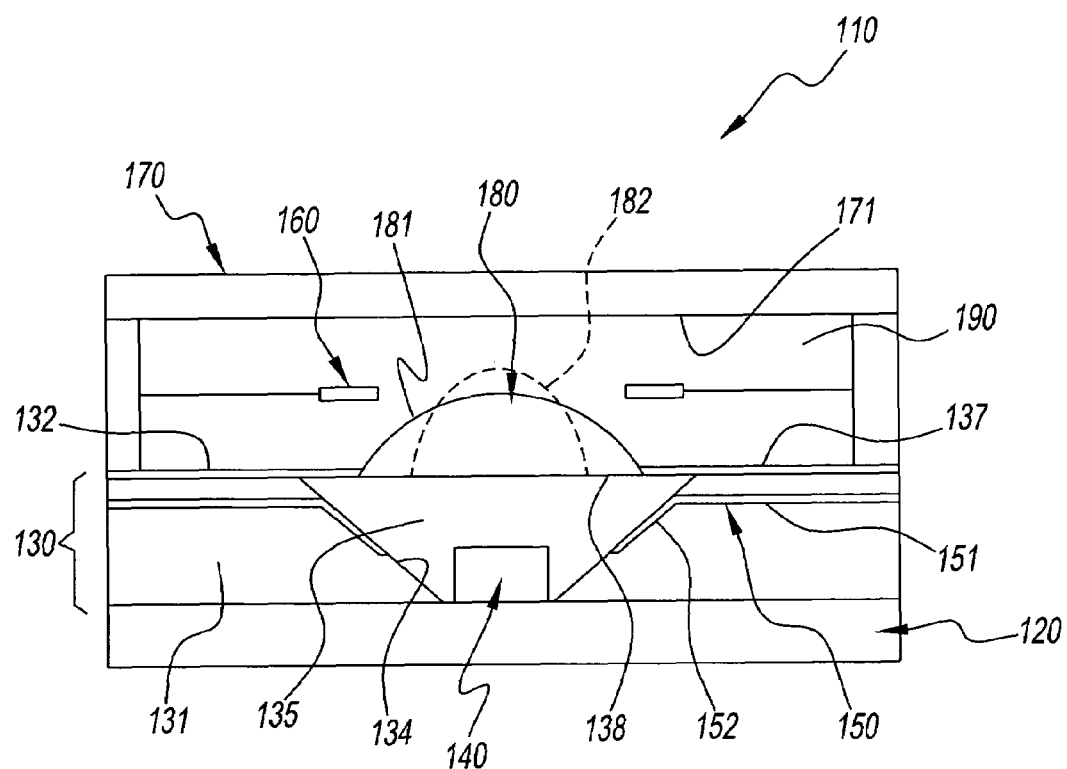
FIG. 3 is a cross section showing the second embodiment of the light-emitting device of the present invention.
Figure 4:
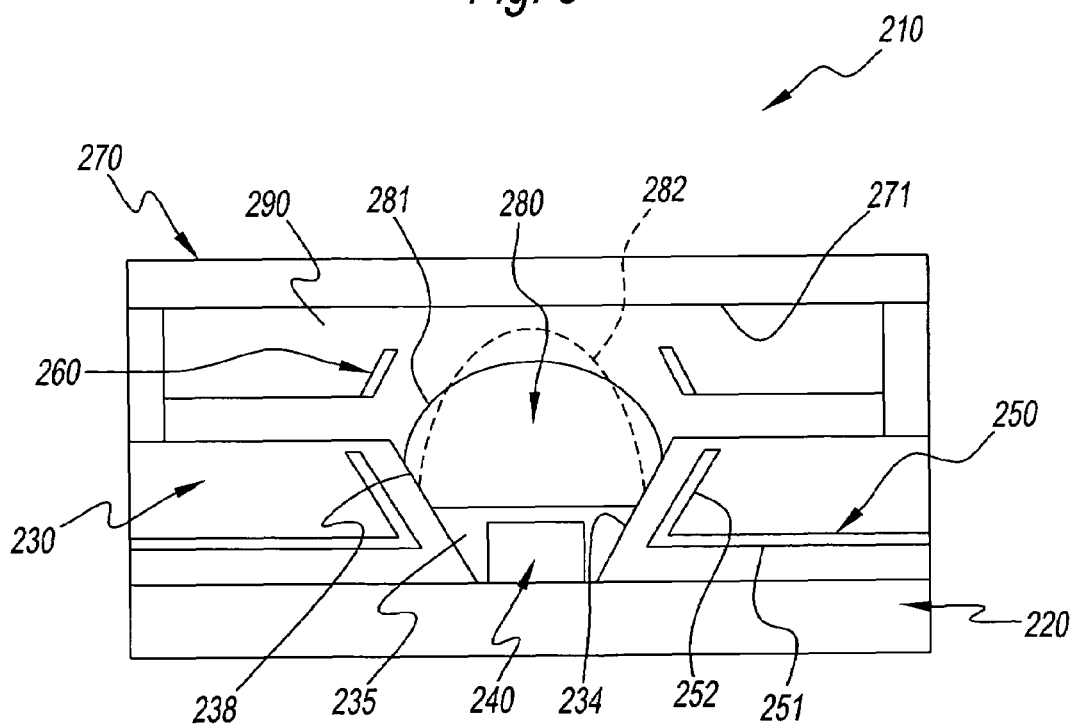
FIG. 4 is a cross section showing the third embodiment of the light-emitting device of the present invention.
Figure 5:
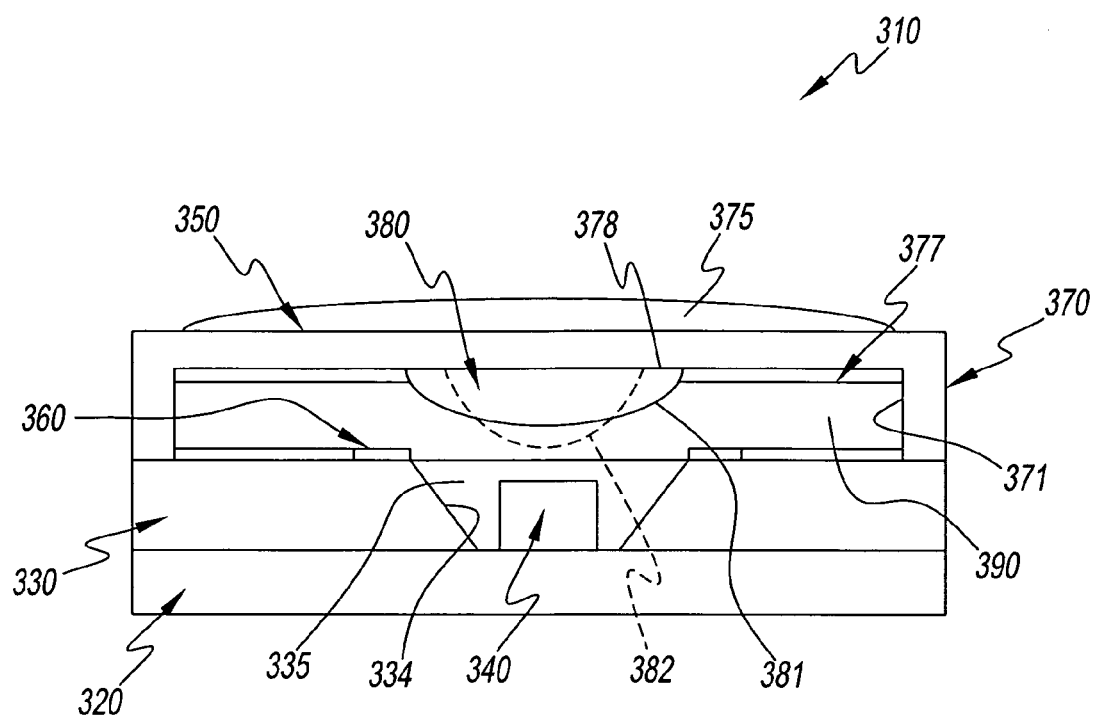
FIG. 5 is a cross section showing the fourth embodiment of the light-emitting device of the present invention.

FIGS. 3 through 5 are cross-sections similar to FIG. 1 representing the light-emitting devices of the second through fourth embodiments of the present invention. By way of comparison with the fifth and sixth embodiments described later, these devices have a characteristic in common with the first embodiment in that the liquid lens means do not have a sub-assembly.

A light-emitting device 110 in FIG. 3, which is the second embodiment, has the same primary structural parts as light-emitting device 10 in FIG. 1. The structural parts shown by numbers wherein 100 is added to the reference number in FIG. 1 have the same effect as the structural part shown in FIG. 1. What should be noted with respect to light-emitting device 110 in FIG. 3 is that the dimensions of the opening of open part 134 are relatively large. As a result, light-emitting device 110 is structurally characterized in that, in addition to almost the entire top surface of bottom container 30, there is a hydrophilic part 137 at the area around the outside of the top surface of resin 135, and electrode 150 comprises a horizontal part 151 extending horizontally and an inclined part 152 extending along the inside surface of open part 134.

It is also possible to make a transparent lid-like member of a pre-determined thickness that engages with the top end of open part 134 as a modified version of this embodiment when the top surface of resin 135 is not flat enough, or other problems occur. In this case, the necessary surface treatment can be performed on the top surface of the lid-like member and the first liquid can be disposed on top.

A light-emitting device 210 in FIG. 4, which is the third embodiment, is a modified version of light-emitting device 10 in FIG. 1 and differs from light-emitting device 10 and light-emitting device 110 in that it does not have the surface modified part that extends horizontally. The structural parts represented by numbers wherein 200 has been added to the reference number in FIG. 1 have the same effect as the structural parts in FIG. 1.

Resin 235 introduced to the inside of open part 234 does not fill the entire open part 235 in light-emitting device 210. As a result, first liquid 280 is disposed aligned on top of resin 235 with the inclined surface of open part 234, which is inclined such that it extends deeper toward the middle of open part 235. Moreover, related to this, first electrode 250 comprises a horizontal part 251 and an inclined part 252 that extends away from the inside surface of open part 234 and virtually parallel along the inside surface, and second electrode 260 is positioned inclined as shown in the drawing such that it is away from first liquid 280 near the top rim of open part 234 and it does not interfere with the light path of the light from light-emitting element 240. The wettability of part 238 on the inclined inside surface of open part 234 by second liquid 290 is improved and the shape of the interface is improved by the field produced between first and second electrodes 250 and 260.

A light-emitting device 310 in FIG. 5, which is the fourth embodiment, is yet another version of light-emitting device 10 in FIG. 1. First liquid 380 is separated from the layer of resin 335 by second liquid 390 and forms a convex dome that points downward toward light-emitting element 340. The structural parts shown by numbers wherein 300 is added to the reference number in FIG. 1 have the same effect as the structural parts shown in FIG. 1.

According to FIG. 5, top container 370 comprises hydrophilic part 377 that has been formed by surface treatment or another treatment of all of the inside of the top wall except a center portion. First liquid 380 is usually disposed as shown by the solid line on the inside of this hydrophilic part. The rest of airtight space 371 is filled by second liquid 390. This differs from the embodiments in FIGS. 1 through 3 mainly in that the positions of first and second liquids 380 and 390 are reversed.

First electrode 350 for controlling liquid lens means 380 and 390 is disposed on the outside away from the inside surface of top container 370. First electrode 350 is disposed such that at least part of the electrode overlaps first liquid 380; therefore, first electrode 350 is made from ITO or another transparent electrode [material] such that the light from light-emitting element 340 is reflected efficiently to the outside. Moreover, as shown in the drawing, an additional lens part 375 that is formed at the same time as top container 370 is molded is made in the top surface of top container 370.

On the other hand, second electrode 360 is shown in FIG. 5 such that it is formed on the top surface of bottom container 330 by printing or another method, but as in the above-mentioned embodiments, it can be disposed at a position close to a position opposite part 378 supported so that it extends from the inside surface of top container 370.

By means of the first step for producing light-emitting device 310 of FIG. 5, light-emitting element 340 is mounted on substrate 320, bottom container 330 is anchored around the outside of the element, and resin is introduced inside open part 334, as shown in FIG. 3(*a*). In this case, first electrode 360 is preformed on the top surface of bottom container 330 as previously mentioned.

Although not illustrated, by means of the second step, the necessary surface treatment is then performed and hydrophilic part 337 is formed on the inside surface of top container 370 wherein first electrode 350 is anchored. By means of the third step, first liquid 380 and second liquid 390 are disposed at a position in the drawing on the inside of top container 370. It is preferred that the assembly during step 3 is performed with the top and bottom reversed, opposite to that shown in FIG. 5.

Figure 6:
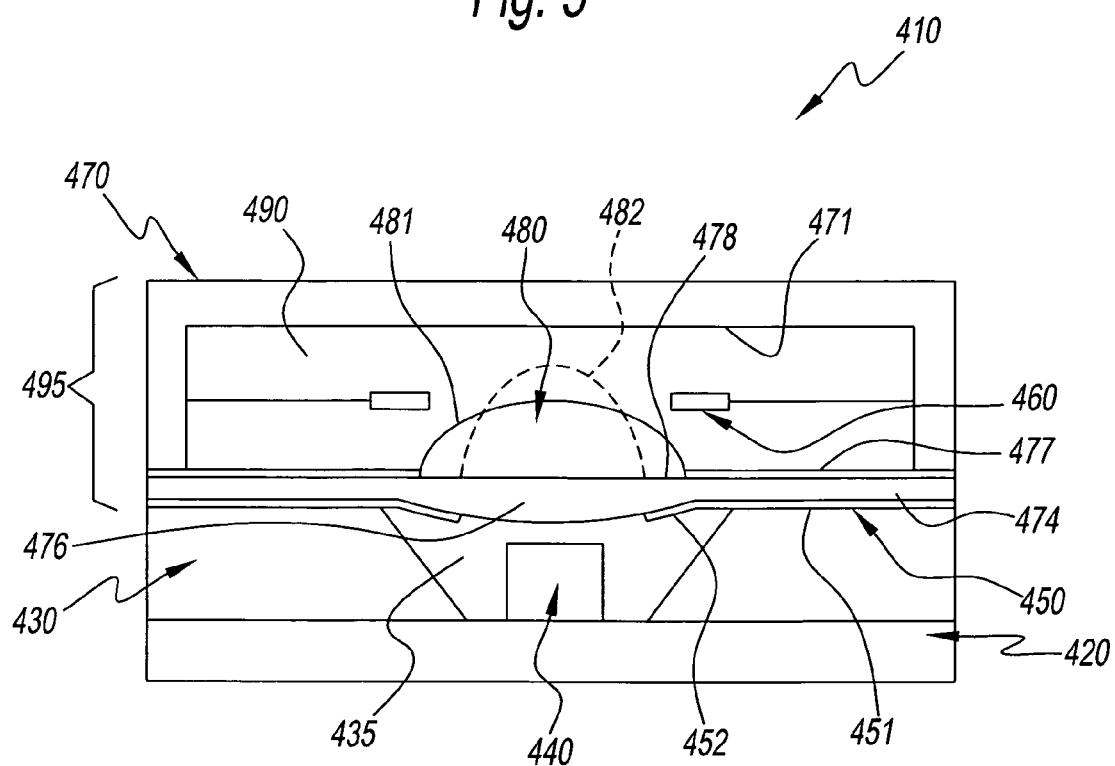
FIG. 6 is a cross section showing the fifth embodiment of the light-emitting device of the present invention.

FIG. 6 is a cross section showing the light-emitting device that is the fifth preferred embodiment of the present invention. It differs from the first embodiment in that liquid lens means 480 and 490 comprise a sub-assembly 495. The structural parts that are shown by numbers wherein 400 has been added to the reference number in FIG. 1 have the same effect as the structural parts in FIG. 1.

Sub-assembly 495 comprises top container 470 and a base wall 474. Hydrophilic part 477 is formed by surface treatment of the top surface of base wall 474. On the other hand, first electrode 450 is formed by printing or another means along the base of base wall 474. The center of base wall 474 comprises a lens for the condensation of light and an enlarged part 476 that serves as a projection for the evacuation of air bubbles from at least near the center is made during assembly. Consequently, first electrode 450 has a horizontal part 451 and a curved part 452 that projects out toward enlarged part 476.

Figure 7:
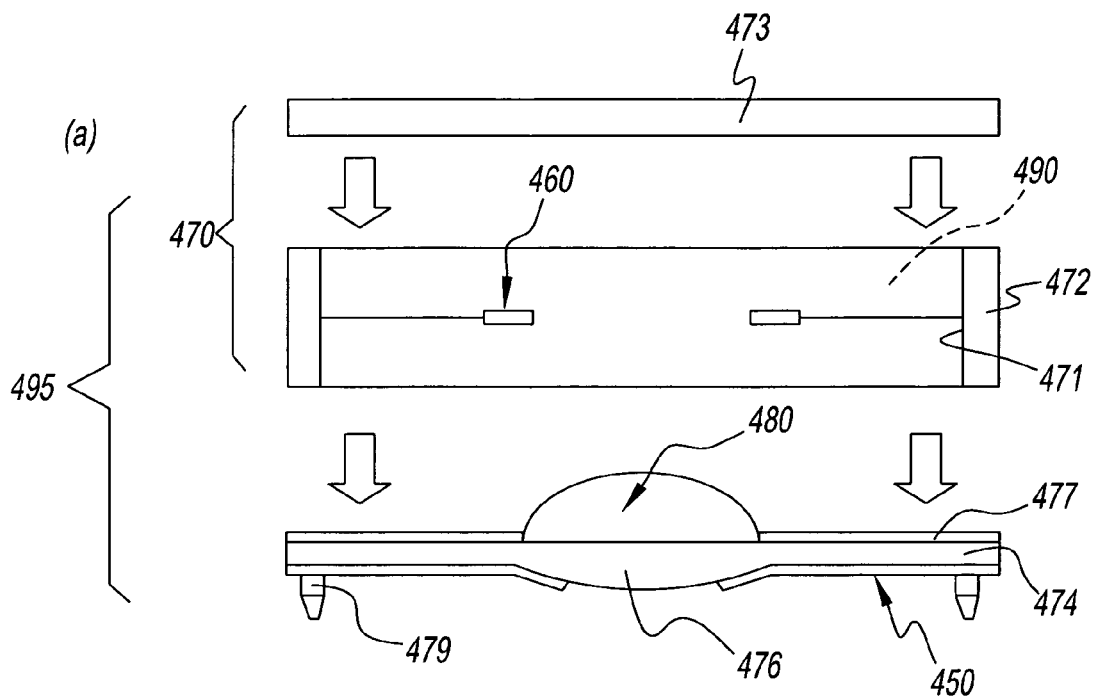
FIG. 7 is a cross section showing the method for producing the light-emitting device in FIG. 6.
Figure 7:
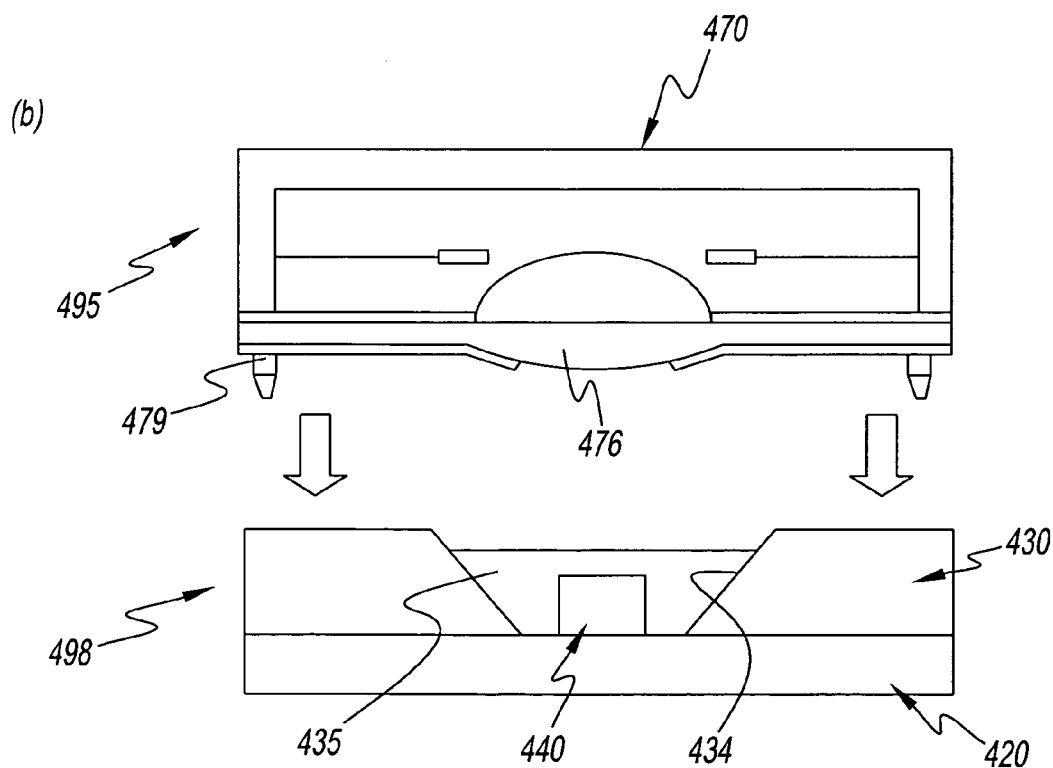

FIG. 7 shows the method for producing light-emitting diode 410 shown in FIG. 6. FIGS. 6(*a*) and (*b*) show the first and second steps, respectively.

By means of the first step, sub-assembly 495 is produced. The step for producing this sub-assembly 495 comprises each step of molding of base 474, forming first electrode 450 on top of the base of base wall 474, and forming hydrophilic part 477 by surface treatment of the top surface of base wall 474. The molding of base wall 474 includes the formation of alignment means for aligning with bottom container 430 during assembly as described below. There must be a window made from a transparent material at least near the center of base wall 474. Part of the window can be separately formed by a material that is different from the material used for the other part and anchored to an outside frame of base wall 474 once this frame has been molded.

First liquid 480 is disposed at the resulting base wall 474. Base wall 474 is assembled as box 472 comprising a top container 470, but first liquid 480 can be introduced after the base wall has been assembled. As shown in the Fig., second electrode 460 is anchored to box 472.

Box 472 is fastened on top of base wall 474 and first liquid 480 is deposited on the inside of hydrophilic part 477 by surface tension. Then second liquid 490 is introduced such that it fills the inside of airtight space 471. Sub-assembly 495 is completed by fastening lid 473 that forms top container 470.

By means of the second step, sub-assembly 495 is assembled as a sub-assembly 498 on the side of the light-emitting element comprising light-emitting element 440, substrate 420, and bottom container 430. An alignment means 479 that is shown as a post is housed in a hole of a complementary shape made in bottom container 430 in conformity with light-emitting element 440 and the optical axis of the lens system. Moreover, bottom container 430 comprises an electrical connection means that is not illustrated, and when sub-assemblies 495 and 498 are mechanically engaged, glued, or anchored by another means, the first and second electrodes can be electrically connected to substrate 20, which is connected to another circuit board.

Figure 8:
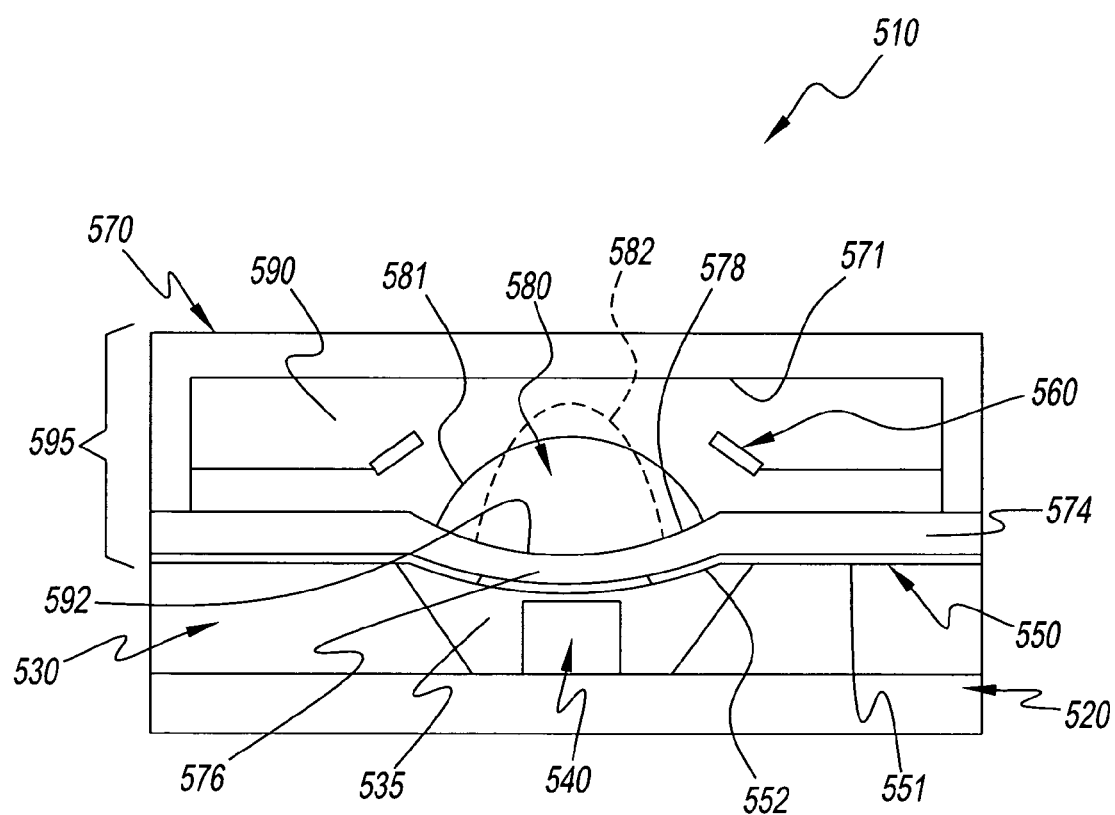
FIG. 8 is a cross section showing the sixth embodiment of the light-emitting device of the present invention.

FIG. 8 is a cross section similar to FIG. 1 showing the light-emitting device of the sixth preferred embodiment of the present invention. It shares a characteristic with light-emitting device 410 shown in FIG. 7 in that a liquid lens means forms the sub-assembly. This device shares the structural parts shown in FIGS. 1 and 7, and 500 is added to the reference numbers in FIG. 1, or the numbers that begin with 4 in FIG. 6 begin with the number 5 [in FIG. 8].

The difference from light-emitting device 410 shown in FIG. 6 is that the part formed by surface treatment of the top surface of base wall 574 is not formed. A concave part 592 is formed instead, and first liquid 580 is positioned on the inside of this concave part 592. As illustrated, second electrode 560 is disposed inclined so that it is away from first liquid 580. The production method is the same as shown in FIG. 7, with the exception that there is no surface treatment step.

Figure 9:
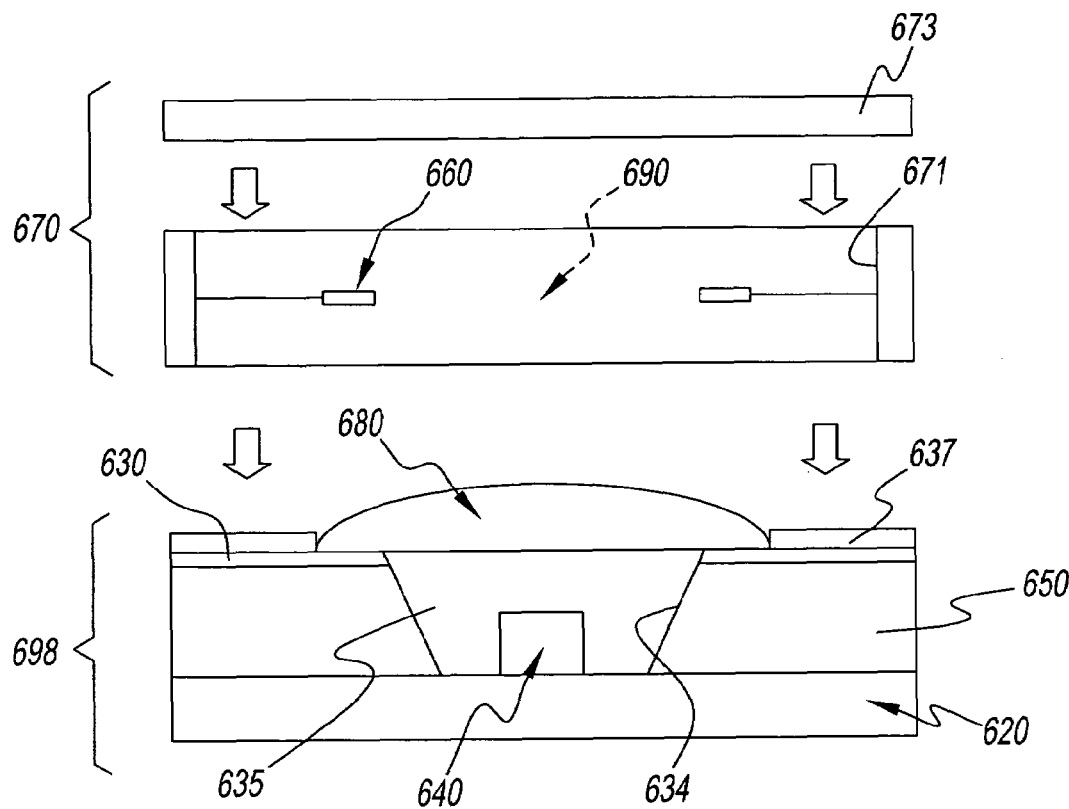
FIG. 9 is a cross section showing the seventh embodiment of the light-emitting device of the present invention, and (a) is the state during assembly and (b) is the completed state.
Figure 9:
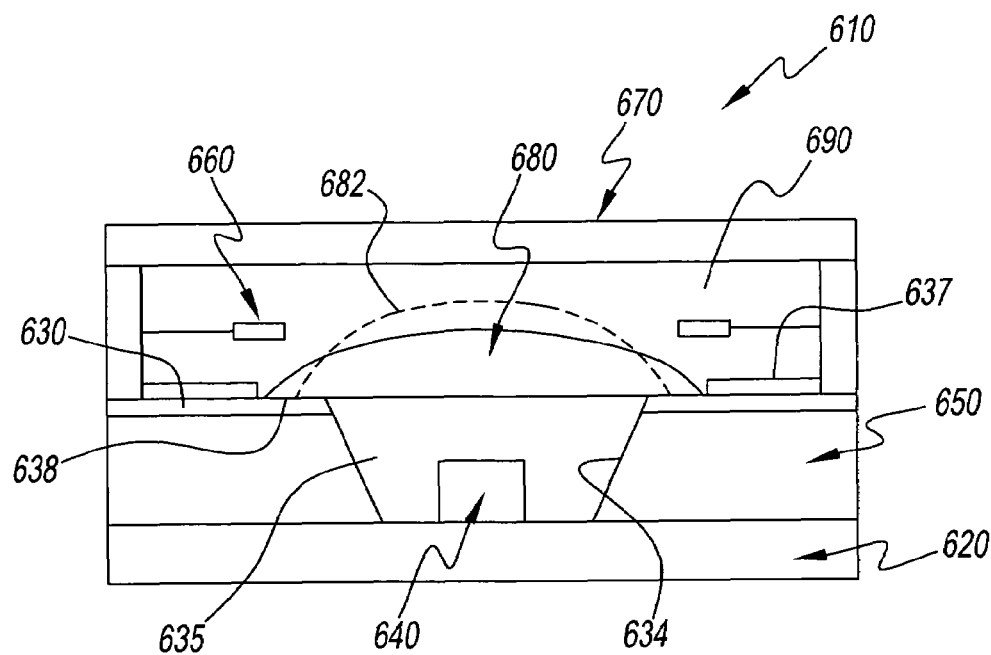

FIG. 9 is a drawing showing the light-emitting device that is a seventh embodiment of the present invention. FIG. 9(*a*) shows the state during production, and FIG. 9(*b*) shows the completed state. The light-emitting device of the present embodiment is similar in terms of structure and operation to light-emitting device 10 of the first embodiment in FIG. 1. The parts that have the same effect are shown with 600 added to the reference number. The difference from light-emitting device 10 is an electrode 635 and the method by which the isolated structure thereof is produced.

The light-emitting device in FIG. 9 is made by assembling top container 670 on top of sub-assembly 698 comprising light-emitting element 640. A conductive part 650 that forms the electrode is used for sub-assembly 698 comprising light-emitting element 640. The entire conductive member 650 is made from a conductive metal, or it is made by depositing a conductive coating on the surface of an insulating material. Conductive member 650 is of sufficient thickness and is enclosed around the outside of light-emitting element 640. It is possible to provide an effective condensing function for [the light from] light-emitting element 640 when the inside surface 634 of open part 634 of conductive member 650 reflects light emitted from light-emitting element 640.

A coating 630 is formed by insulating material over the entire top surface of conductive member 640. Surface treated part 637 is formed around the outside of part 638 on the top of insulating coating 630. Part of insulating coating 630 is modified by surface-treated part 637, or a coating is separately applied to the top of insulating coating 630.

By means of this structure, electrode 650 and first liquid 680 and second liquid 690 are insulated as in the other embodiments, and a field can be provided such that it intersects part 638 by interaction between first electrode 650 and second electrode 660. That is, the first liquid is as shown by the solid line in FIG. 9(b) when a field is not applied, and as shown by the broken line when a field is applied. As a result, the condensed state of the light from light-emitting element 640 is changed.

Figure 10:
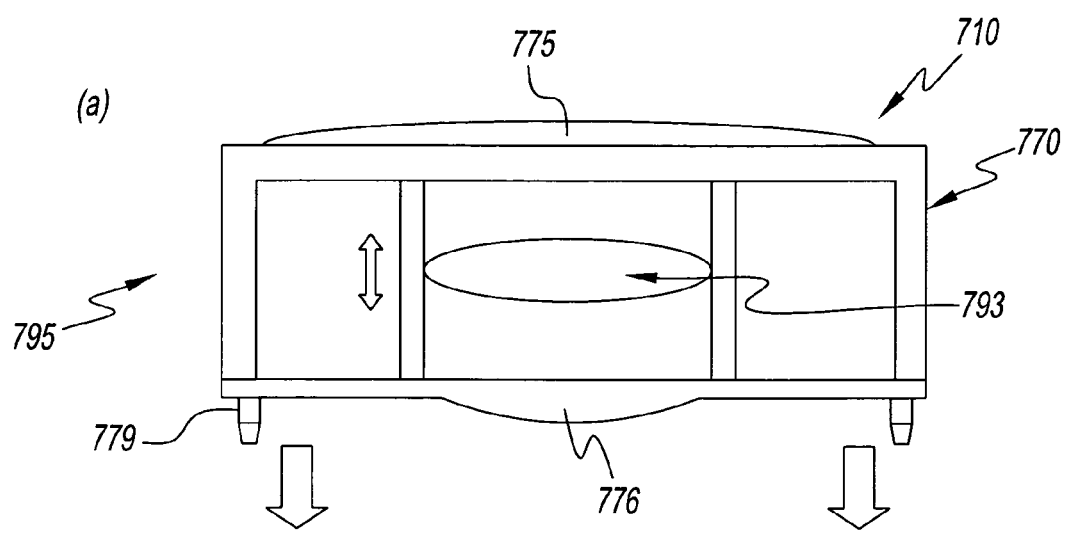
FIG. 10 is a cross section showing the eighth embodiment of the light-emitting device of the present invention, and (a) is the state during assembly and (b) is the completed state.
Figure 10:
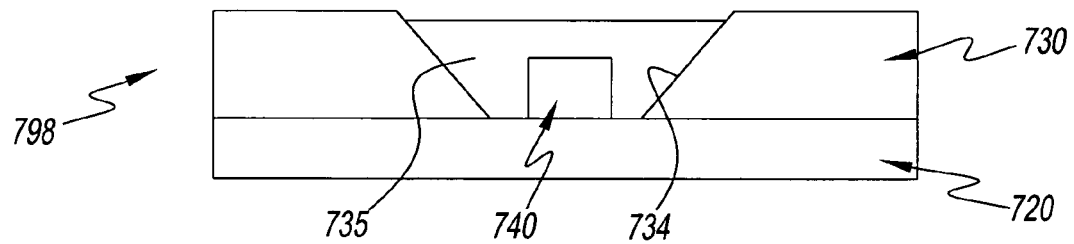
Figure 10:
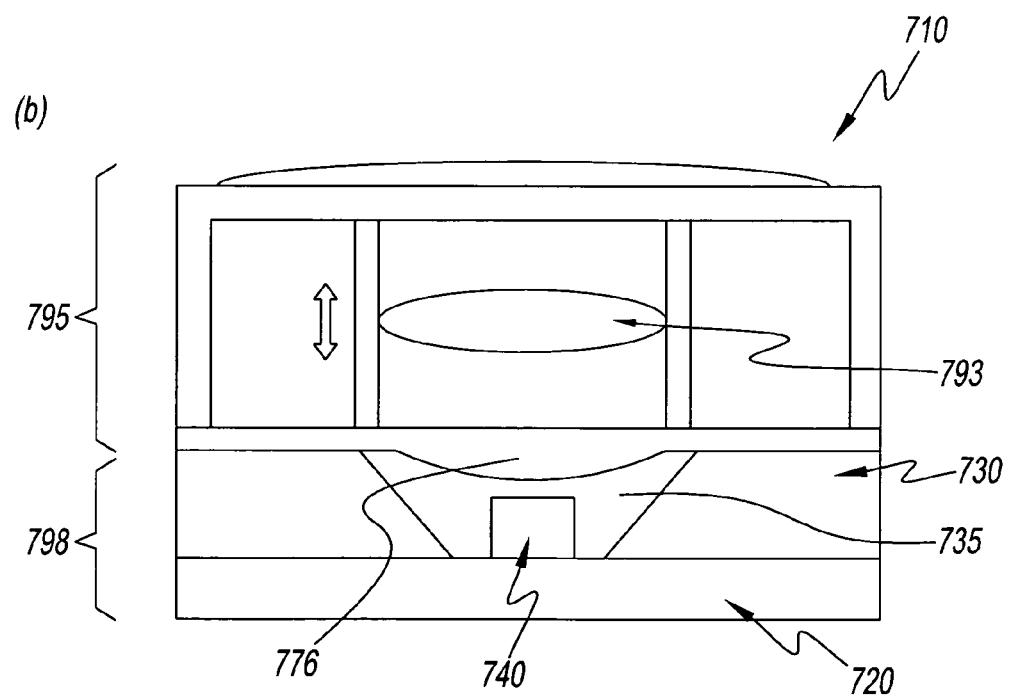

FIG. 10 is a cross section representing the light-emitting device that is the eighth embodiment of the present invention. FIG. 10(a) is a drawing of the assembly process and FIG. 10(b) is a drawing of the completed state. By means of the present embodiment, a light-emitting device 710 comprises actuator-type module 795, which has a lens system with a lens that is moved mechanically in place of the liquid lens. That is, one or several lenses 793 are moved inside module 795 to change the condensed state of light irradiated from light-emitting device 740.

Light-emitting device 710 comprises module 795 and light-emitting element assembly 798 on the side of the light-emitting element. The light-emitting element assembly comprises substrate 720 on which light-emitting element 740 is mounted, and bottom container 730 enclosing light-emitting element 740 on substrate 720, as in the other embodiments.

Module 795 comprises movable lens 793 inside container 770. There is a first anchored lens 775 on the top surface of the module, and a second anchored lens 776, which protrudes down in the center, at the base of the module. Alignment means 779 is further produced around the outside of the base. Part of second anchored lens 776 can prevent the formation of air bubbles at least near the center of resin 735 when assembled with light-emitting element assembly 798. Moreover, the optical axis of module 795 and light-emitting element 740 can be precisely aligned by the aligning effect of aligning means 779. It should be noted that module 795 and light-emitting element assembly 798 can be glued and anchored together by resin 735, or by a resin having adhesion that is different from that of resin 735. An example of the resin for gluing in this case is silicone resin.

Preferred embodiments of the light-emitting device and the method for producing the same of the present invention have been described in detail, but it goes without saying that these are only examples and in no way limit the present invention, and various modifications and changes by persons skilled in the art are possible.

Figure 11:
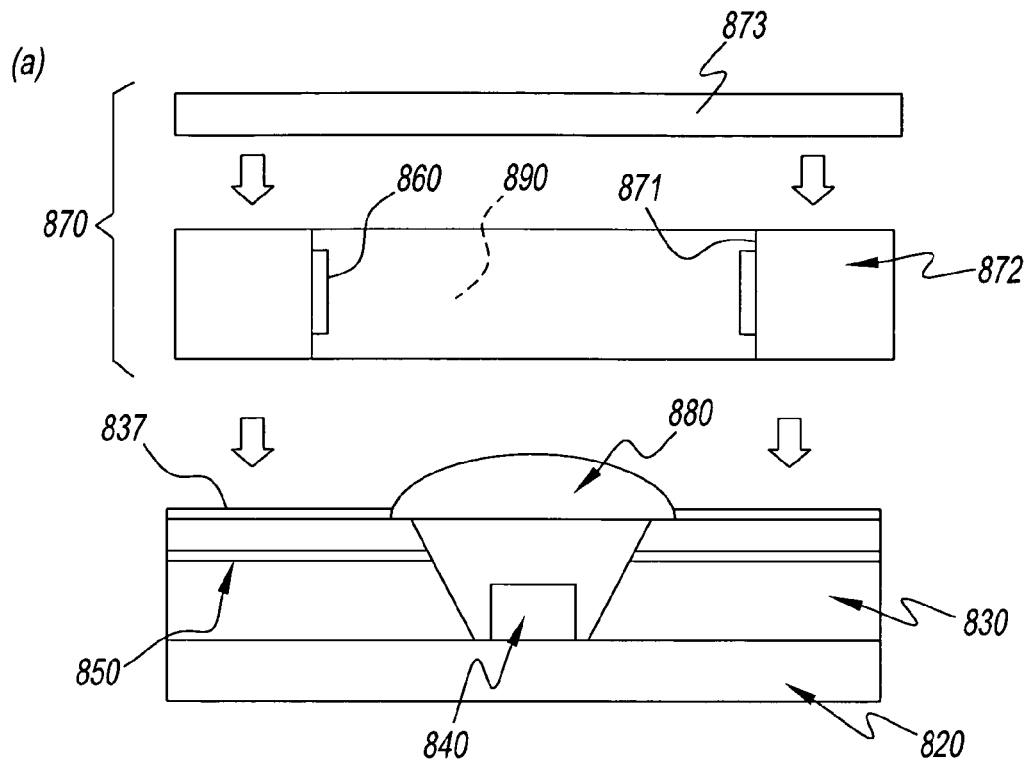
FIG. 11 is a drawing of the second electrode used in embodiments other than the fourth embodiment (refer to FIG. 5).
Figure 11:
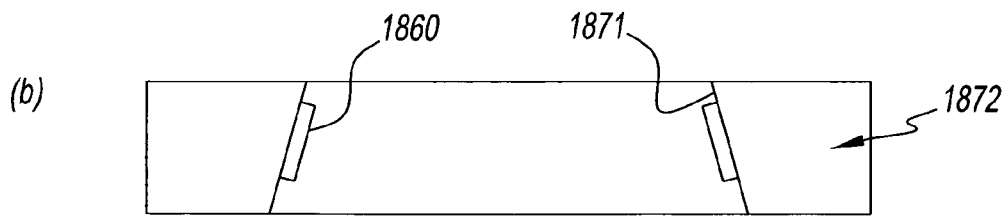
Figure 11:
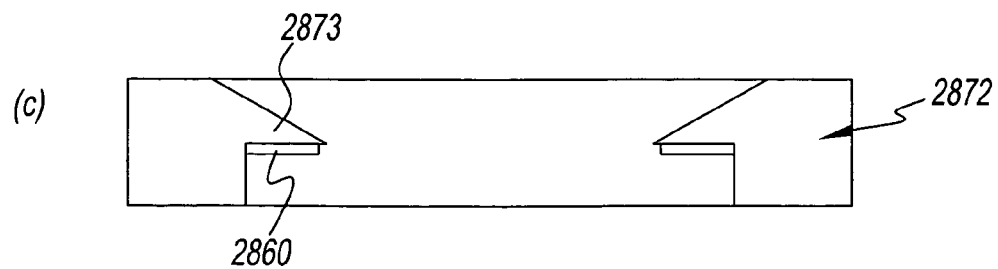
Figure 12:
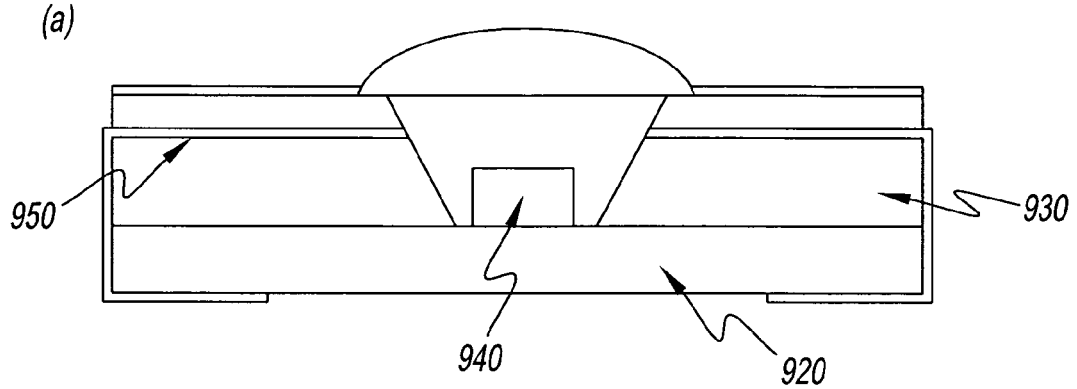
FIG. 12 is a drawing showing the method for forming a connecting substrate or lead that leads to the first or second electrode and protrudes out from the light-emitting device that can be applied to any of the above-mentioned embodiments.
Figure 12:
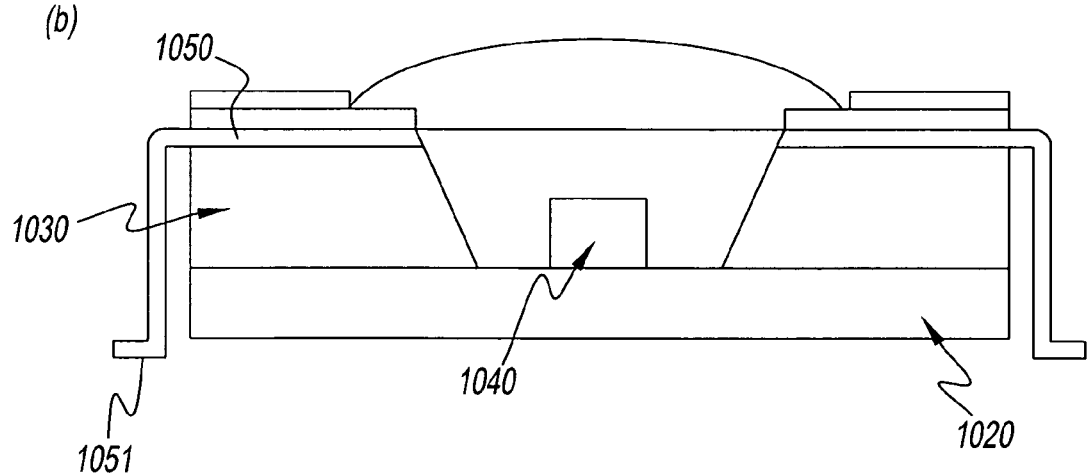

FIGS. 11 and 12 show other versions of the method for producing the electrodes that can be used in the light-emitting device of the above-mentioned embodiments. FIG. 11 is an example of the formation of a second electrode that is used in embodiments other than the fourth embodiment (refer to FIG. 5). The structural elements that are the same as those in the other embodiments are shown by reference numbers to which 800 is added and a description is not given.

As shown in FIG. 11(a), second electrode 860 is anchored or deposited along the inside surface of box 872 by the process for making top container 870. As shown in FIG. 11(a), second electrode 860 can be formed such that it extends perpendicular along inside surface 871; as shown in FIG. 11(b), an inside surface 1871 of the open part of a box 1872 can be formed such that it is inclined and s second electrode 1860 can be disposed facing the direction of inclination; or as shown in FIG. 11(c), a protruding wall 2873 can be made on the inside surface of the open part of a box 2872 such that a horizontal surface can be formed facing down, and a second electrode 2860 can be formed along this horizontal surface.

FIG. 12 shows a method for forming a connecting substrate or lead that leads to the first or second electrode and extends from the light-emitting device. This can be used in any of the above-mentioned embodiments. A lead or an electrode 950 can be formed by printing or deposition along the surface of a bottom container 930 and a substrate 920 made from insulation, as shown in (a) of the same Fig. In this case, the lead or electrode connected to an electrode (not illustrated) for supplying power and leading to a light-emitting element 940 is similarly formed. In this case, the lead for controlling the lens system and the lead for supplying power to light-emitting element 940 extend from bottom container 930 and substrate 920 in the different directions such as in juxtaposition or by intersecting.

In another case, a lead 1051 connected to the first or second electrode on the inside or at the surface of bottom container 930 can extend out from a bottom container 1030 and a substrate 1020, as shown in (b) of the same Fig. As in (a) of the same Fig., the electrodes that come from a light-emitting element 1040 similarly can be connected to an outside circuit that uses lead 1051.

What is claimed is:

1. A method for producing a light-emitting device that comprises:

placing a semiconductor light-emitting element on a substrate;

forming a container with space on the inside and comprising a window with a light-permeable material, a first electrode formed away from the inside space, and a second electrode placed inside the inside space that, together with the first electrode, generates a field that intersects the inside wall demarcating the inside space;

filling the container with a first liquid for condensing light from the semiconductor light-emitting element and a second liquid that is separate from the first liquid, but contacts the first liquid, and is near the second electrode;

airtight sealing of the container and completing the sub-assembly comprising the container;

forming at least one post on at least one of said sub-assembly and said semiconductor light-emitting element on the substrate and forming at least one hole in the other of said sub-assembly and said semiconductor light-emitting element on the substrate;

after said airtight sealing and said completing, anchoring the sub-assembly to the semiconductor light-emitting element on the substrate; and aligning said sub-assembly with the semiconductor light-emitting element on the substrate by engaging at least a portion of said at least one post within at least a portion of said at least one hole.

2. A light-emitting device which comprises as one unit:
a first portion comprising a semiconductor light-emitting element;
a second portion comprising:
second portion housing defining a second portion interior located at least partially within said second portion housing;
an airtight space located at least partially within said second portion interior;
a first liquid for condensing light from the semiconductor light-emitting element;
a second liquid that is separate from the first liquid;
wherein, said first liquid touches said second liquid, thereby defining an interface between said first liquid and said second liquid, said interface defining a shape; and
wherein said first liquid and said second liquid are at least partially located within said airtight space;
an electrode for generating a field that intersects a part of said airtight space such that said shape of said interface between said first liquid and said second liquid is changed and the condensed state of the light from the semiconductor light-emitting element is adjusted;
wherein said first portion of said light-emitting device is in contact with said second portion of said light-emitting device;
wherein at least one post is formed on at least one of said first portion and said second portion and a hole is formed in at least the other of said first portion and said second portion; and
wherein said post is at least partially located within said hole.

3. The light-emitting device according to claim 2, wherein said electrode comprises:
a first electrode portion located at least partially within said first portion; and
a second electrode portion located at least partially within said second portion.

4. The light-emitting device according to claim 2, wherein said first and second liquids are selected from materials with different wetting capabilities for a solid surface.

5. The light-emitting device according to claim 4, wherein said first liquid comprises an insulating material that can intensely wet a hydrophobic surface and the second liquid comprises a conducting material that can intensely wet a hydrophilic surface.

6. The light-emitting device according to claim 2, wherein said first liquid is positioned over said semiconductor light-emitting element.

7. The light-emitting device according to claim 2, wherein said second portion is made in a sub-assembly comprising an airtight housing and the sub-assembly has a window for receiving light from the semiconductor light-emitting element.

8. The light-emitting device according to claim 7, wherein:
said airtight housing has a base comprising a convex portion
said airtight housing is anchored in alignment with the first portion comprising the semiconductor light-emitting element.

9. The light-emitting device according to claim 2 and further wherein:
said post is formed on said second portion; and
said hole is formed in said first portion.

10. The light-emitting device according to claim 3 and further wherein:
said first liquid is adapted to focus said light from said semiconductor light-emitting element along an optical axis;
said second portion housing further comprises an inner wall surface facing said second portion interior;
said second electrode portion in at least partially mounted on said inner wall surface.

11. The light-emitting device according to claim 10 and further wherein:
said inner wall surface is parallel to said optical axis.

12. The light-emitting device according to claim 10 and further wherein:
said inner wall surface is inclined with respect to said optical axis.

13. The light-emitting device according to claim 10 and further wherein:
said inner wall surface is perpendicular to said optical axis.

14. The method according to claim 1 and further wherein:
said forming at least one post comprises forming said at least one post on said subassembly; and
said forming at least one hole comprises forming said at least one hole in said semiconductor light-emitting element on the substrate.

* * * * *

UNITED STATES PATENT AND TRADEMARK OFFICE
CERTIFICATE OF CORRECTION

| | | |
|---|---|---|
| PATENT NO. | : 7,569,867 B2 | |
| APPLICATION NO. | : 11/252917 | |
| DATED | : August 4, 2009 | |
| INVENTOR(S) | : Sumio Shimonishi et al. | |

It is certified that error appears in the above-identified patent and that said Letters Patent is hereby corrected as shown below:

Column 11, Line 9, Claim 2, before "second" insert --a--.

Column 12, Line 29, Claim 10, delete "in" and insert --is--.

Signed and Sealed this
Twenty-fifth Day of September, 2012

David J. Kappos
*Director of the United States Patent and Trademark Office*